United States Patent
Kim

(10) Patent No.: US 7,548,464 B2
(45) Date of Patent: Jun. 16, 2009

(54) METHOD FOR SETTING PROGRAMMING START BIAS FOR FLASH MEMORY DEVICE AND PROGRAMMING METHOD USING THE SAME

(75) Inventor: Suk Kyung Kim, Jeonju-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 168 days.

(21) Appl. No.: 11/771,465

(22) Filed: Jun. 29, 2007

(65) Prior Publication Data

US 2008/0106944 A1 May 8, 2008

(30) Foreign Application Priority Data

Nov. 3, 2006 (KR) .................. 10-2006-0108441

(51) Int. Cl.
*G11C 11/34* (2006.01)
(52) U.S. Cl. .............................. 365/185.24; 365/185.18
(58) Field of Classification Search ............ 365/185.24, 365/185.18, 185.19, 185.22
See application file for complete search history.

(56) References Cited

U.S. PATENT DOCUMENTS

| 5,959,883 | A | 9/1999 | Brennan, Jr. et al. | |
| 6,392,931 | B1 | 5/2002 | Pasotti et al. | |
| 6,519,184 | B2 * | 2/2003 | Tanaka et al. | 365/185.22 |
| 7,085,168 | B2 * | 8/2006 | Lee et al. | 365/185.24 |
| 7,184,336 | B2 * | 2/2007 | Chiang et al. | 365/201 |
| 7,379,342 | B2 * | 5/2008 | Park et al. | 365/185.22 |
| 2006/0077736 | A1 | 4/2006 | Nakagawa et al. | |

FOREIGN PATENT DOCUMENTS

| JP | 11-031391 | 2/1999 |
| KR | 1020060037648 A | 5/2006 |
| KR | 1020060075161 A | 7/2006 |
| KR | 1020060107689 A | 10/2006 |

* cited by examiner

*Primary Examiner*—Anh Phung
(74) *Attorney, Agent, or Firm*—Townsend and Townsend and Crew LLP

(57) ABSTRACT

A method for setting a programming start bias for a flash memory device to perform a programming operation is provided. First, the method performs pre-programming to change a threshold voltage distribution of a selected transistor using a first programming voltage and detects the maximum threshold voltage level of the changed threshold voltage distribution. The method then calculates the difference between the detected maximum threshold voltage level and a target maximum threshold voltage level and sets a start bias to a voltage obtained by adding the calculated difference to the first programming voltage.

23 Claims, 5 Drawing Sheets

METHOD FOR SETTING PROGRAMMING START BIAS FOR FLASH MEMORY DEVICE AND PROGRAMMING METHOD USING THE SAME

CROSS-REFERENCES TO RELATED APPLICATIONS

The present application claims priority to Korean patent application number 10-2006-108441, filed on Nov. 3, 2006, which is incorporated by reference in its entirety.

BACKGROUND OF THE INVENTION

The present invention relates to a flash memory device, and more particularly to a method for setting a programming start bias for a NAND flash memory device using an Incremental Step Pulse Programming (ISPP) scheme and a method for programming a NAND flash memory device using the programming start bias setting method.

Generally, a NAND flash memory includes a string of cells connected in series. The string may include one or more string selection transistors. An operation for programming and/or erasing a NAND flash memory device is performed through tunneling such as Flower-Nordheim (F-N) tunneling. Specifically, the operation for programming a NAND flash memory device uses coupling between the gate and channel. For example, a cell that is to be programmed has a relatively large voltage difference between the gate and channel while a cell that is not to be programmed has a relatively small voltage difference between the gate and channel. The operation for programming a NAND flash memory device also involves a cell threshold voltage distribution.

Generally, the cell threshold voltage distribution is adjusted using an Incremental Step Pulse Programming (ISPP) scheme. According to the general ISPP scheme, programming is performed by sequentially applying biases, beginning with a start bias which is incremented in steps of $\Delta V$, as shown in FIG. 1. That is, programming is first performed with the first bias $V_{ISPP1}$ as the start bias and is then performed with the second bias $V_{ISPP2}$ obtained by increasing the first bias $V_{ISPP1}$ by $\Delta V$. This process is repeated until the last bias $V_{ISPPn}$ is applied. A programming verification process is performed with a relatively low verification bias $V_{verify}$ between each programming period. It is known in the art that performing such an ISPP programming suppresses the occurrence of over-programming. Over-programming is a phenomenon in which a read operation of a cell fails because part of the programmed cell threshold voltage distribution exceeds the read voltage.

However, using the ISPP scheme, it is not possible to avoid widening of the cell threshold voltage distribution as shown in FIG. 2 for a variety of reasons. Specifically, cell threshold voltage distributions 220, 230, and 240, which are widened compared to the ideal cell threshold voltage distribution 210, may be due to parasitic effects such as verify vs. read offset, programming speed, back pattern dependency, and floating gate coupling. In addition, the cell threshold voltage distribution may move to the right due to programming and erasure cycling. The widening or right movement of the cell threshold voltage distribution may cause an over-programming phenomenon, resulting in a failure of the device.

BRIEF SUMMARY OF THE INVENTION

Embodiments of the present invention relate to a method for setting a programming start bias for a flash memory device using an ISPP scheme to prevent the occurrence of an over-programming phenomenon even if the cell threshold voltage distribution has been widened or moved to the right due to parasitic effects or cycling.

Also embodiments of the present invention relate to a method for programming a flash memory device using the above programming start bias setting method.

In one embodiment, a method for setting a programming start bias for a flash memory device to perform a programming operation according to an ISPP scheme comprises performing pre-programming to change a threshold voltage distribution of a selected transistor using a first programming voltage; detecting a maximum threshold voltage level of the changed threshold voltage distribution; calculating a difference between the detected maximum threshold voltage level and a target maximum threshold voltage level; and setting a start bias to a voltage obtained by adding the calculated difference to the first programming voltage.

In other embodiment, a method for programming a flash memory device to perform a programming operation according to an ISPP scheme comprises performing pre-programming to change a threshold voltage distribution of a selected transistor using a first programming voltage; detecting a maximum threshold voltage level of the changed threshold voltage distribution; calculating a difference between the detected maximum threshold voltage level and a target maximum threshold voltage level; setting a start bias to a voltage obtained by adding the calculated difference to the first programming voltage; and performing programming by alternately adding a programming bias, which is incremented by a predetermined level starting from the start bias, and a verification bias for programming verification to the selected transistor.

DETAILED DESCRIPTION OF THE INVENTION

Figure 1:
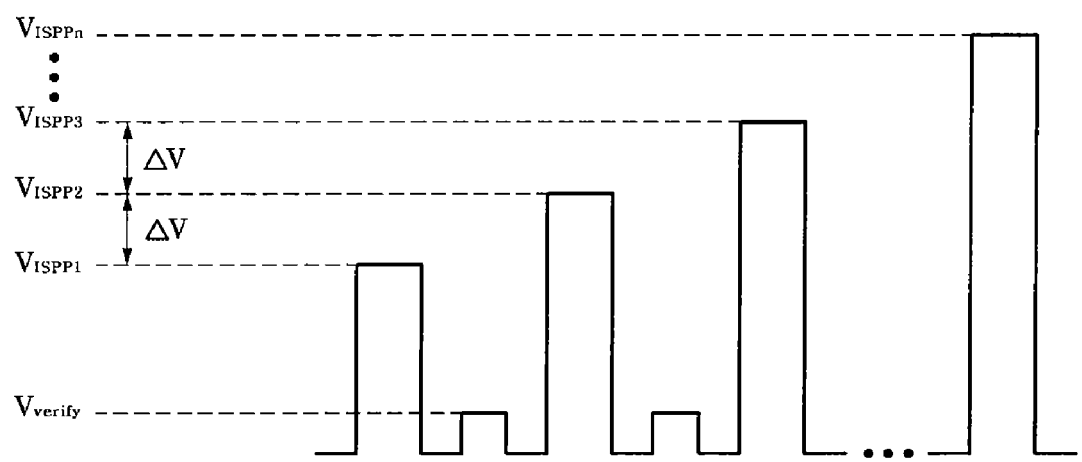
FIG. 1 is a waveform diagram illustrating a general Incremental Step Pulse Programming (ISPP) scheme.
Figure 2:
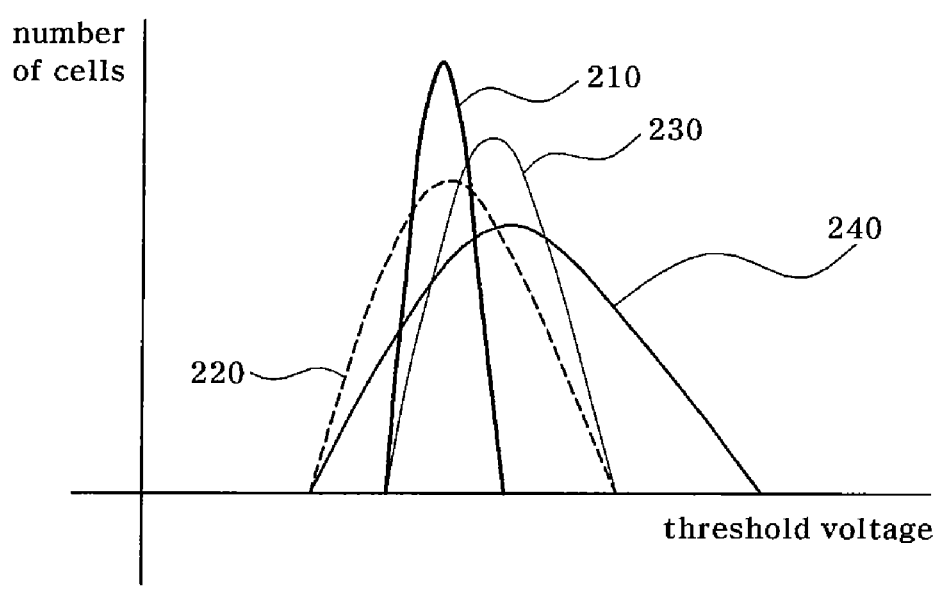
FIG. 2 is a graph illustrating widening of a cell threshold voltage distribution due to parasitic effects.
Figure 3:
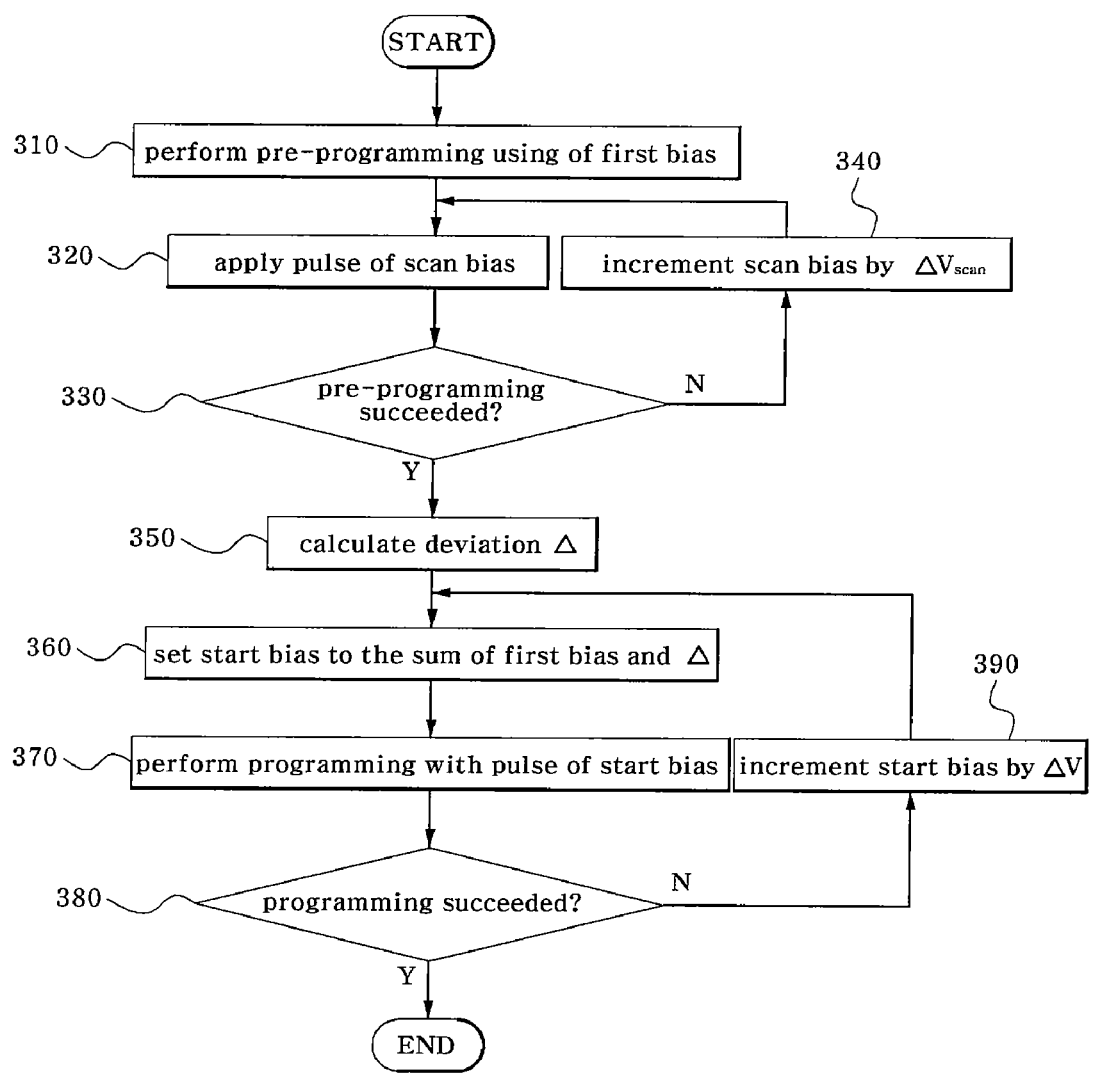
FIG. 3 is a flow chart illustrating a method for setting a programming start bias for a flash memory device according to the present invention.
Figure 4:
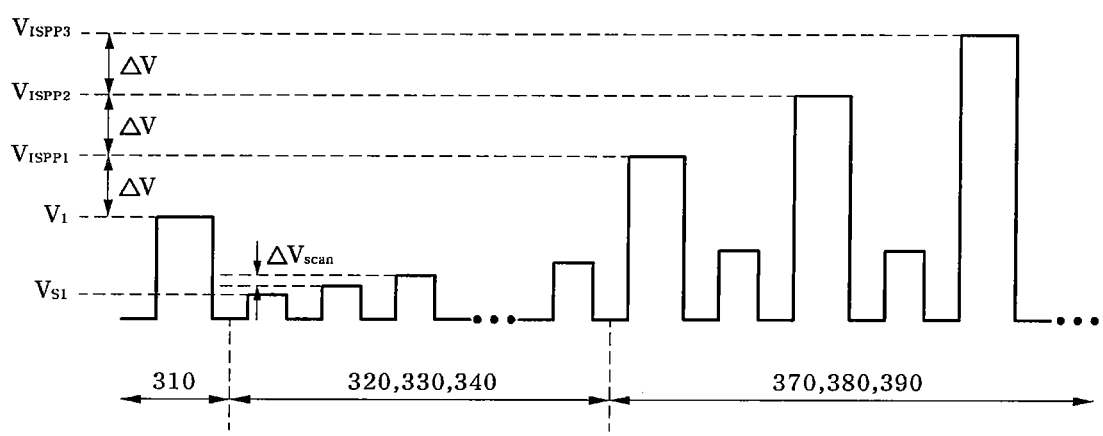
FIG. 4 illustrates pulse waveforms according to an Incremental Step Pulse Programming (ISPP) scheme used in a programming method according to the present invention.

FIG. 3 is a flow chart illustrating a method for setting a programming start bias for a flash memory device and a programming method using the same according to the present invention. FIG. 4 illustrates pulse waveforms according to an Incremental Step Pulse Programming (ISPP) scheme used in the programming method according to the present invention.

Figure 5:
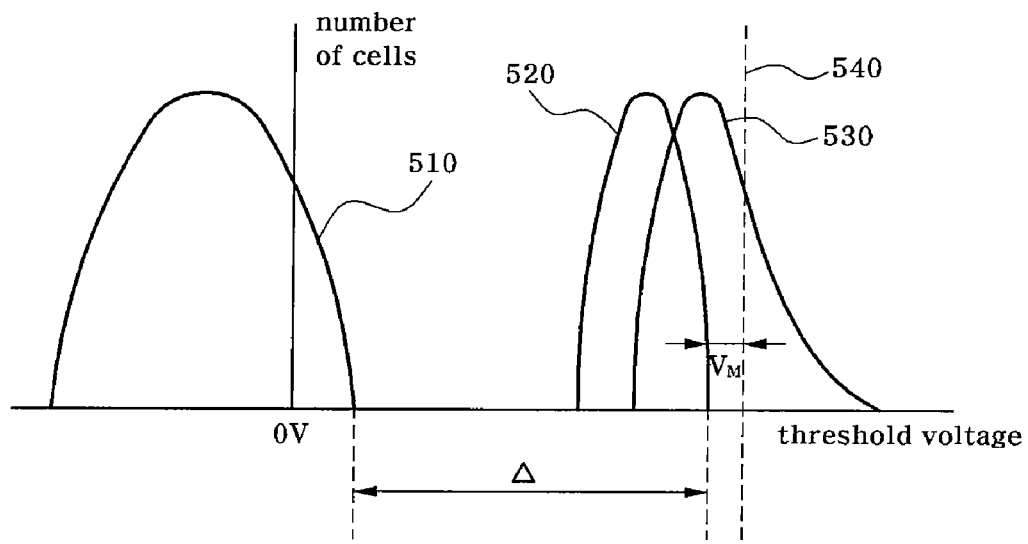
FIGS. 5 and 6 are diagrams of threshold voltage distributions illustrating a method for setting a programming start bias according to the present invention.

As shown in FIGS. 3 and 4, pre-programming is first performed with a first bias $V_1$ (step 310). (*REMOVE THE WORD "OF" IN FIG. 3 STEP 310*) The first bias $V_1$ used to perform the pre-programming has a level in the range of about 13V to 22V (e.g., 16V). If the pre-programming is performed in this manner, selected transistors have a cell threshold voltage distribution 510 that has a magnitude and width as shown in FIG. 5. The cell threshold voltage distribution 510 is formed so as to include 0V. For example, when pre-programming is performed with the first bias V1 at a level in the range of 13 to 22V (e.g., 16V), a right portion of the cell threshold voltage distribution 510 exceeds 0V as shown in FIG. 5.

A cell threshold voltage distribution 520 to be achieved is also shown in FIG. 5. This cell threshold voltage distribution 520 to be achieved is predefined so as to have a specific over-programming margin $V_M$ (e.g., in the range of 1V to 3V). The margin $V_M$ is to compensate for the shifting of the voltage distribution 520 to a cell threshold voltage distribution 530 after cycling. That is, the maximum threshold voltage level of the preset cell threshold voltage distribution 520 is set to be about 1V to 3V lower than a read voltage 540, shown by a dashed line, that is applied to a word line during a read operation.

Under certain situations, the maximum threshold voltage level of the preset cell threshold voltage distribution 520 may be set based on a programming verification voltage. In this case, the maximum threshold voltage level of the predefined cell threshold voltage distribution 520 may be set to be equal to a voltage level obtained by adding an ISPP step bias $\Delta V$ to the programming verification voltage. For example, the maximum threshold voltage level of the preset cell threshold voltage distribution 520 is about 1.5V if the programming verification voltage is 1V and the ISPP step bias $\Delta V$ is 0.5V.

After pre-programming is performed, a deviation (or difference) ($\Delta$) between the cell threshold voltage distribution 520 to be achieved (or desired) and the cell threshold voltage distribution 510 formed by the pre-programming is obtained (steps 320, 330, 340, 350). To accomplish this, a scanning process is first performed to find the maximum threshold voltage level of the cell threshold voltage distribution 510 obtained by pre-programming.

Figure 6:
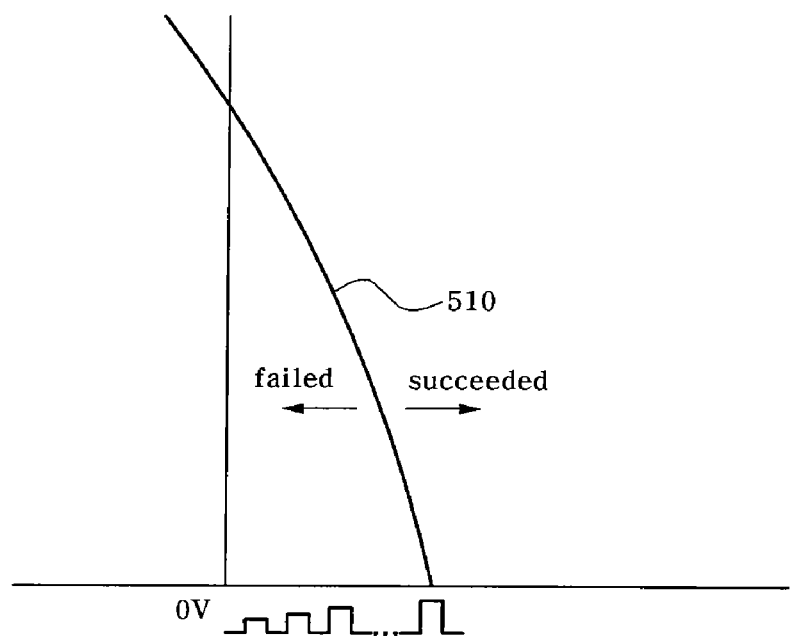

Specifically, a pulse of a scan bias $V_{si}$ is applied to transistors that have been subjected to pre-programming as shown in FIG. 6 (step 320). Since the threshold voltage distribution 510 obtained by pre-programming is formed to include 0V, the scanning starts from 0V and accordingly the scan bias $V_{si}$ may be 0V.

After the pulse of the scan bias $V_{si}$ is applied, it is determined whether or not the programming has succeeded (i.e., whether or not its verification has passed) (step 330). The programming is determined to be a success if the selected transistor is not turned on when the pulse of the scan bias $V_{si}$ is applied to a word line of the selected transistor. The programming is determined to be a fail if the selected transistor is turned on when the pulse of the scan bias $V_{si}$ is applied.

If the programming is determined to have succeeded, the level of the applied scan bias $V_{si}$ is deemed to be substantially equal to that of the maximum threshold voltage level and the deviation $\Delta$ is calculated accordingly (step 350). However, the programming is determined to have failed, the maximum threshold voltage level is deemed to have not yet been reached and an incremental scan bias $\Delta V_{scan}$ (e.g., at a level of 0.05V to 0.8V) is added to the scan bias $V_{si}$ (step 340). The procedure then returns to step 320. The bias of a pulse applied at this step is the sum of the scan bias $V_{si}$ and the incremental scan bias $\Delta V_{scan}$. It is then determined again whether or not the programming has succeeded (step 330). If the programming has failed, the step 340 of adding the incremental scan bias $\Delta V_{scan}$ to the scan bias $V_{si}$ and the step 320 of applying a pulse of the added scan bias are repeated until the programming succeeds.

After the maximum threshold voltage level of the cell threshold voltage distribution 510 formed by pre-programming is scanned, a deviation $\Delta$ between the maximum threshold voltage level of the cell threshold voltage distribution 520 to be achieved and the scanned maximum threshold voltage level of the cell threshold voltage distribution 510 is calculated (step 350). The deviation $\Delta$ can be obtained by subtracting the scanned maximum threshold voltage level from the maximum threshold voltage level of the cell threshold voltage distribution 520 to be achieved. After obtaining the deviation $\Delta$, a voltage level obtained by adding the deviation $\Delta$ to the first bias V1 used in the pre-programming is set as a start bias $V_{ISPP1}$ as shown in FIG. 4 (step 360).

After setting the start bias $V_{ISPP1}$ at step 360, programming is performed using a pulse with this start bias $V_{ISPP1}$ (step 370). Then, normal programming verification is performed (step 380). Specifically, a verification voltage is applied to the word line of the selected transistor to determined whether or not the programming has been performed properly (step 380). If it is determined that the programming has been performed properly and thus the programming of the cell has succeeded, the programming procedure of the cell is finished. However, if the programming of the cell has failed, the step bias $\Delta V$ is added to the start bias $V_{ISPP1}$ and a second bias $V_{ISPP2}$ is set as the start bias (step 390). The procedure then returns to step 370 to repeat programming using a pulse with the set second bias $V_{ISPP2}$ (step 370). The procedure is repeated until all cells are programmed properly.

As is apparent from the above description, a method for setting a programming start bias for a flash memory device and a programming method using the same according to the present invention have a variety of advantages. For example, it is possible to reduce the total programming time since a relatively short scanning time is required, compared to when a general ISPP scheme is used. Even though the cell threshold voltage distribution has moved to the right by cycling, it is possible to suppress the occurrence of an over-programming phenomenon since the start bias is set such that the cell threshold voltage distribution has a sufficient margin.

Although the above embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method for setting a programming start bias for a flash memory device, the method comprising:
    performing pre-programming a selected memory cell using a first programming voltage;
    measuring a highest threshold voltage of the selected memory cell after the pre-programming;
    calculating a difference between the highest threshold voltage and a target highest threshold voltage of a target threshold voltage distribution; and
    setting a start bias by adding the difference to the first programming voltage for the programming operation.

2. The method according to claim 1, further comprising;
    implementing the programming operation using an Incremental Step Pulse Programming (ISPP) method after setting the start bias.

3. The method according to claim 1, wherein the first programming voltage is within a range of 13V to 22V.

4. The method according to claim 1, wherein the first programming voltage is 16V.

5. The method according to claim 1, wherein the pre-programming is performed such that the highest threshold voltage exceeds 0V.

6. The method according to claim 1, wherein the step of measuring the highest threshold voltage includes:

applying a scan bias to the selected memory cell after the pre-programming; and checking the selected memory cell is passed.

7. The method according to claim 6, wherein the checking the selected memory cell is not passed, rechecking the selected memory cell adding a step bias to the scan bias.

8. The method according to claim 7, further comprising:
repeating the applying, checking, and adding the step bias until the selected memory cell is passed.

9. The method according to claim 7, wherein the step bias is at a level of 0.05V to 0.8V.

10. The method according to claim 6, wherein an initial level of the scan bias is 0V.

11. The method according to claim 1, wherein the highest threshold voltage of the target threshold voltage distribution is set such that a highest threshold voltage of the threshold voltage distribution, which has been increased by cycling, does not exceed a read voltage used for a read operation.

12. The method according to claim 1, wherein the highest threshold voltage of the target threshold voltage distribution is 1V to 3V lower than a read voltage level.

13. A method for programming a flash memory device, the method comprising:
performing pre-programming to a selected memory cell using a first programming voltage;
measuring a highest threshold voltage of the selected memory cell after the pre-programming;
calculating a difference between the highest threshold voltage and a target highest threshold voltage of a target threshold voltage distribution;
setting a start bias by adding the difference to the first programming voltage;
performing the programming operation using the start bias as an initial programming bias; and
verifying the selected memory cell.

14. The method of claim 13, wherein the programming bias is applied a plurality of times, the programming bias being incremented by a predetermined level after each time the programming is applied until a last bias is reached.

15. The method of claim 14, wherein a verification bias for programming verification is applied to the selected memory cell each time after the program bias is applied to the selected memory cell.

16. The method according to claim 13, wherein the first programming voltage is within a range of 13V to 22V.

17. The method according to claim 13, wherein the first programming voltage is 16V.

18. The method according to claim 13, wherein the pre-programming is performed such that the highest threshold voltage exceeds 0V.

19. The method according to claim 11, wherein the measuring the highest threshold voltage includes:
applying a scan bias to the selected memory cell after the pre-programming;
checking the selected memory cell is passed;
rechecking the selected memory cell adding a step bias to the scan bias when the selected memory cell is not passed; and
repeating the applying, checking, and adding the step bias until the selected memory cell is passed.

20. The method according to claim 19, wherein an initial level of the scan bias is 0V.

21. The method according to claim 19, wherein the step scan bias is at a level of 0.05V to 0.8V.

22. The method according to claim 12, wherein the highest threshold voltage of the target threshold voltage distribution is set such that a highest threshold voltage of the threshold voltage distribution, which has been increased by cycling, does not exceed a read voltage used for a read operation.

23. The method according to claim 12, wherein the highest threshold voltage of the target threshold voltage distribution is 1V to 3V lower than a read voltage level.

\* \* \* \* \*